(12) United States Patent
Nieminen

(10) Patent No.: US 7,242,723 B2
(45) Date of Patent: Jul. 10, 2007

(54) DECODER FOR A TRELLIS CODE

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 718 days.

(21) Appl. No.: 10/781,492

(22) Filed: Feb. 18, 2004

(65) Prior Publication Data

US 2004/0190642 A1     Sep. 30, 2004

(30) Foreign Application Priority Data

Feb. 19, 2003   (EP)   ................................ 03100380

(51) Int. Cl.
  *H04L 23/02*   (2006.01)
  *H03M 13/03*   (2006.01)
(52) U.S. Cl. ...................... 375/265; 714/792
(58) Field of Classification Search ................ 375/262, 375/265, 341; 714/792, 794, 795, 796
  See application file for complete search history.

(56) References Cited

U.S. PATENT DOCUMENTS

| 6,504,882 | B1 * | 1/2003 | Kim ........................... 375/341 |
| 2001/0044921 | A1 | 11/2001 | Takahashi et al. |
| 2002/0162074 | A1 * | 10/2002 | Bickerstaff ................ 714/792 |
| 2006/0245487 | A1 * | 11/2006 | Agazzi et al. ............. 375/233 |
| 2006/0262832 | A1 * | 11/2006 | Kaewell .................... 375/141 |

FOREIGN PATENT DOCUMENTS

EP     1 102 408 A2     5/2001

WO     WO 01/78239 A2     10/2001

OTHER PUBLICATIONS

Hendrix, "Viterbi Decoding Techniques in the TMS320C54x Family", Texas Instruments, Jun. 1996.
Black et al., "A Unified Approach to the Viterbi Algorithm State Metric Update for Shift Register Processes", pp. 629-632, Mar. 1992.
Shung et al., Area-Efficient Architectures for the Viterbi Algorithm-Part I Theory, pp. 636-644, Apr. 1993.
Shung et al., Area-Efficient Architectures for the Viterbi Algorithm-Part II Applications, pp. 636-644, Apr. 1993.

* cited by examiner

*Primary Examiner*—Don N. Vo
(74) *Attorney, Agent, or Firm*—Hollingsworth & Funk, LLC

(57) ABSTRACT

The invention relates to trellis code decoder. The decoder comprises a path metrics calculation unit for calculating path metrics over at least two trellis columns in a trellis, and a memory for storing path metrics of the trellis. The decoder further comprises an input multiplexer connected between the read interface of the memory and the input interface of the path metrics calculation unit, and an output multiplexer connected between the output interface of the path metrics calculation unit and the write interface of the memory. The decoder further comprises a control for controlling configuration of the input multiplexer and configuration of the output multiplexer on the basis of states of the trellis, which state of the trellis defines the way the old path metrics and the new path metrics relate to each other, whereby internal configuration of the path metrics calculation unit remains the same for different code constraint lengths.

5 Claims, 4 Drawing Sheets

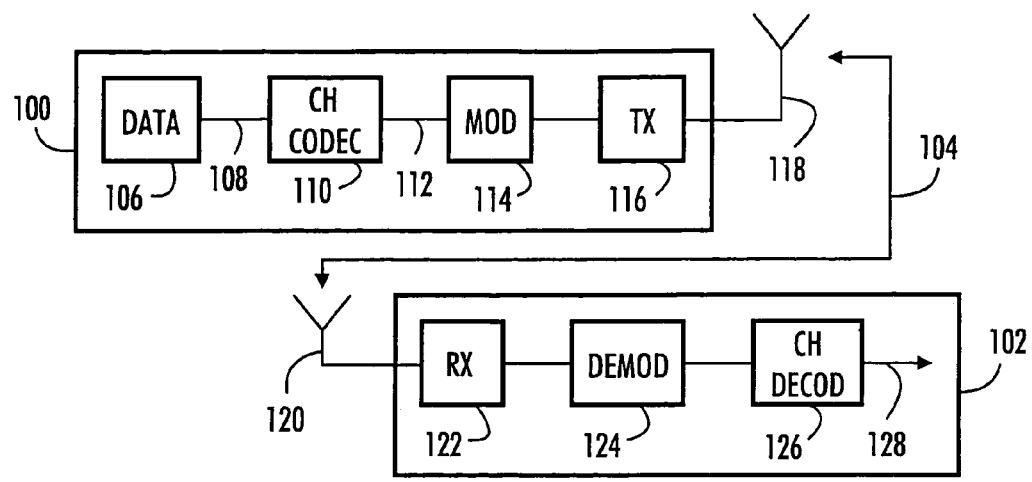
FIG. 1
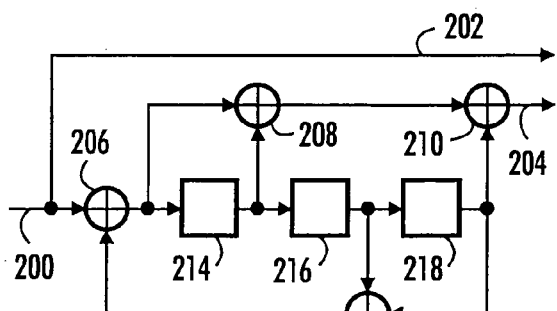
FIG. 2
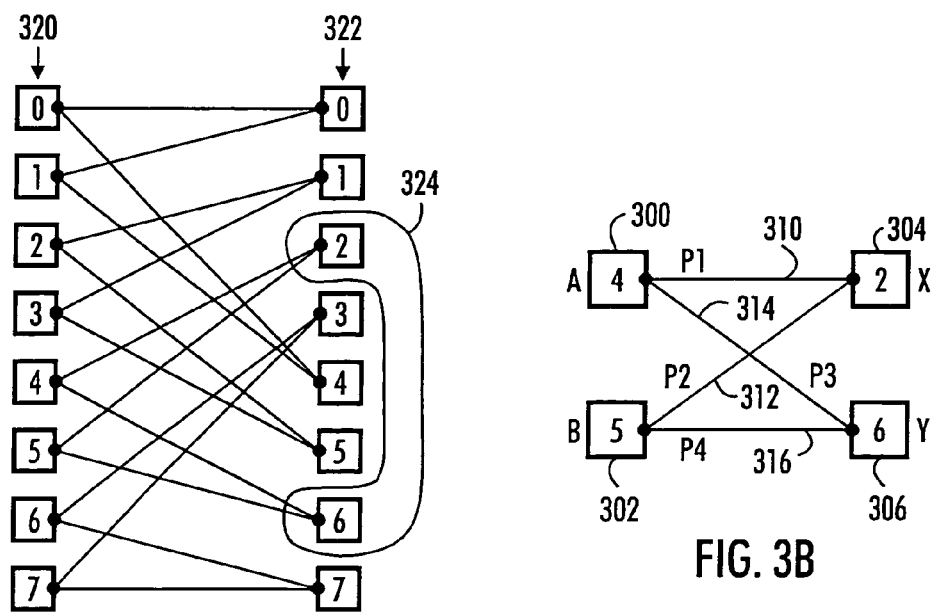
FIG. 3A
FIG. 3B

DECODER FOR A TRELLIS CODE

FIELD

The invention relates to a decoder for a trellis code.

BACKGROUND

The channel used in telecommunications systems frequently causes interference in data transmission. Interference occurs in all kinds of systems but particularly in wireless telecommunications systems the transmission path attenuates and distorts the signal to be transmitted in various ways. On the transmission path interference is typically caused by multi-path propagation of the signal and different kinds of fading and reflection as well as by other signals transmitted on the same transmission path.

To reduce the influence of interference, different coding methods have been provided to protect signals from interference and to eliminate errors caused by interference in the signals. One frequently used encoding method is convolutional encoding. In convolutional encoding the signal consisting of symbols is encoded into code words, which are based on the convolution of the symbols with themselves or with another signal. The coding rate and coding polynomials define the convolutional code. The coding rate (k/n) means the number (n) of encoded symbols in relation to the number (k) of symbols to be encoded. The coding is usually implemented by means of shift registers. The constraint length K of the code refers to the degree of coding polynomials plus one. The coding process may be regarded as a state machine with $2^{K-1}$ states.

A signal that has propagated on a channel is decoded in a receiver. The convolutional code can be both encoded and decoded using a trellis whose nodes (or equally states) correspond to the states of the encoder used in signal encoding and the paths between nodes belonging to two successive trellis columns of the trellis correspond to allowed state transitions between the encoder states. The code unequivocally attaches the beginning and the end state of the transition, the bit under encoding and the bits of the encoding result to each state transition. The purpose of the decoder is thus to determine successive states of the coder, i.e. transitions from one state to another, which are caused by the original bits. To determine the transitions, metrics are calculated in the decoder. There are two kinds of metrics: path metrics (also state metrics) and branch metrics. The path metrics represent the probability at which the set of symbols included in the received signal leads to the state corresponding to the node in question. The branch metrics are proportional to the probabilities of transitions. A Viterbi algorithm is usually used in decoding of a convolutional code.

The more states the code has, the more complicated decoder is needed. Usually the decoder can calculate for example eight new path metrics in parallel, whereupon 32 successive phases are needed to calculate one trellis column of a 256-state convolutional code. Another possibility is to extend parallel calculation over trellis columns, whereby four ACS-units (Add-Compare-Select) are used for one column, and to which ACS-units four more ACS-units are connected for calculating the path metrics of the next trellis column. With such an arrangement the calculation of the path metrics is advanced by two trellis columns instead of just one. Calculation of one column pair of a 256-state convolutional code necessitates 64 successive phases, but because calculation is performed over two columns, only 32 calculation phases are needed for each column. The calculation efficiency is thus the same as with eight ACS-units processing one column, but the bus width has been halved, which is a significant advantage, especially if there exists a great number of ACS-units.

We are interested in the solution wherein calculation over at least two trellis columns is performed, especially of interest is the control of the data flow routing, i.e. how old path metrics are retrieved into a path metrics calculation unit from the memory and how new path metrics are stored in the memory from the path metrics calculation unit. The prior art solutions have too complicated bus arrangements, especially if the same decoder is used for several different codes each having a different number of states.

BRIEF DESCRIPTION

The present invention seeks to provide an improved decoder for a trellis code.

According to an aspect of the present invention, there is provided a decoder for a trellis code, comprising: a path metrics calculation unit for calculating path metrics over at least two trellis columns in a trellis, the path metrics calculation unit including an input interface for old path metrics and an output interface for new path metrics; a memory for storing path metrics of the trellis, the memory including a read interface for reading old path metrics from the memory and a write interface for writing new path metrics into the memory; an input multiplexer connected between the read interface of the memory and the input interface of the path metrics calculation unit; an output multiplexer connected between the output interface of the path metrics calculation unit and the write interface of the memory; and a control for controlling configuration of the input multiplexer and configuration of the output multiplexer on the basis of states of the trellis, which state of the trellis defines the way the old path metrics and the new path metrics relate to each other, whereby internal configuration of the path metrics calculation unit remains the same for different code constraint lengths.

The solution of the invention is especially effective when the code has many states, for example 64, 128, 256 states or more. In the invention the routing of path metric buses is controlled with the help of the states of the code. With the invention the routing structures for buses are unified so that the same path metrics calculation unit can be used for decoding of codes having different code constraint lengths.

LIST OF FIGURES

Preferred embodiments of the invention are described below by way of example and with reference to the attached drawings, in which FIG. 1 is a simplified block diagram illustrating a transmitter and a receiver;

FIG. 2 illustrates an eight-state systematic and recursive convolutional code encoder;

FIG. 3A illustrates two successive trellis columns, and FIG. 3B illustrates a butterfly chart;

DESCRIPTION OF EMBODIMENTS

Figure 4A:
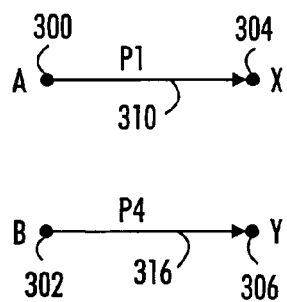
FIGS. 4A, 4B, 4C and 4D illustrate feasible combinations of winner paths in the butterfly chart of FIG. 3B.

First we will describe, with reference to FIG. 1, an example of a transmitter 100 and a receiver 102 where the decoder for the trellis code can be used. In the example of FIG. 1 the transmitter 100 and the receiver 102 communicate via a radio channel 104. The transmitter 100 comprises a data source 106, which may be a speech encoder or another conventional data source used in circuit-switched or packet-switched data transmission. A signal 108 to be transmitted is received from the output of the data source and supplied to a channel encoder 110, which in this case is a convolutional encoder. The encoded symbols 112 are supplied to a modulator 114, where the signal is modulated in a prior art manner. The modulated signal is supplied to radio frequency parts 116, where it is amplified and transmitted to the radio path 104 by an antenna 118.

On the radio path 104 the signal is affected by interference and typically by noise, too. The receiver 102 comprises an antenna 120 for receiving the signal, which is supplied to a demodulator 124 via radio frequency parts 122. The demodulated signal is supplied to a channel decoder 126, where the signal is decoded using the trellis as described below. From the decoder the decoded signal 128 is supplied further to the other parts of the receiver 102.

Next, the principle of the trellis will be explained. It is known that a trellis whose nodes correspond to the encoder states is naturally related to each convolutional code. The nodes of two successive trellis columns are connected by paths, which are determined by the state transitions allowed by the convolutional code. The convolutional code attaches the beginning and the end state, the bit to be encoded and the bits of the encoding result unequivocally to each state transition.

An eight-state systematic and recursive encoder for a convolutional code will be described next with reference to FIG. 2. An input bit, which is described in the first column of Table 1, enters the input 200 of the encoder. The present state of the encoder, i.e. the bits from each block 214, 216, 218 arranged one after another, is illustrated in the second column of Table 1. Columns 2 and 3 present the states using binary numbers, but the corresponding decimal numbers are also presented in parentheses. The contents of the delay elements 214, 216, 218 are interpreted into a binary digit such that the most significant bit is in the delay element 214 and the least significant bit is in the delay element 218. The third column in the table shows the next state of the encoder. The encoder has two outputs: a systematic bit exits from output 202 and a parity bit from output 204, which is illustrated in the fifth column of Table 1. Thus the coding result of one state transition of the encoder comprises two bits: a systematic bit and a parity bit. The encoder further comprises summing blocks 206, 208, 210 and 212 for implementing recursion. Because two output bits are generated for each input bit, the coding rate is ½.

TABLE 1

| Input bit | Present encoder state | Next encoder state | State transition | Parity bit |
|---|---|---|---|---|
| 0 | 000 (0) | 000 (0) | 0 ↔ 0 | 0 |
| 1 | 000 (0) | 100 (4) | 0 ↔ 4 | 1 |
| 0 | 001 (1) | 100 (4) | 1 ↔ 4 | 0 |
| 1 | 001 (1) | 000 (0) | 1 ↔ 0 | 1 |
| 0 | 010 (2) | 101 (5) | 2 ↔ 5 | 1 |
| 1 | 010 (2) | 001 (1) | 2 ↔ 1 | 0 |
| 0 | 011 (3) | 001 (1) | 3 ↔ 1 | 1 |
| 1 | 011 (3) | 101 (5) | 3 ↔ 5 | 0 |
| 0 | 100 (4) | 010 (2) | 4 ↔ 2 | 1 |
| 1 | 100 (4) | 110 (6) | 4 ↔ 6 | 0 |
| 0 | 101 (5) | 110 (6) | 5 ↔ 6 | 1 |
| 1 | 101 (5) | 010 (2) | 5 ↔ 2 | 0 |
| 0 | 110 (6) | 111 (7) | 6 ↔ 7 | 0 |
| 1 | 110 (6) | 011 (3) | 6 ↔ 3 | 1 |
| 0 | 111 (7) | 011 (3) | 7 ↔ 3 | 0 |
| 1 | 111 (7) | 111 (7) | 7 ↔ 7 | 1 |

FIG. 3A illustrates two successive trellis columns 320, 322 of the trellis of the encoder shown in FIG. 2. The numbers in parentheses in the second and the third column of Table 1 refer to the trellis nodes denoted by numbers 0 to 7 in FIG. 3A. Table 1 also shows state transitions of the encoder in the fourth column. Each state has two feasible new states, which are determined according to the input bit to be encoded at a given time. The trellis has one trellis column more than is the number of bits to be encoded and possibly a few extra trellis columns thanks to the termination method used.

A butterfly chart for part 324 of the trellis of FIG. 3A is shown in FIG. 3B. The butterfly chart consists of the nodes 300, 302 of the preceding trellis column 320 and of the nodes 304, 306 of the present trellis column 322. The butterfly chart also includes the allowed state transitions 310, 312, 314, 316.

In the butterfly chart the path metrics of the states n and n+N/2 are calculated from the path metrics of states 2n and 2n+1, where N is the number of states for the code, for example N=8 and n=0,1,2, . . . , N/2−1. The calculation of the path metrics and the branch metrics and the connection between them are determined by the convolutional code and the decoder applied. During the calculation of the path metrics, the transition from one trellis column to another is performed by an ACS-operation (Add-Compare-Select) in the butterfly chart. 'Add' refers to adding the branch metrics of the allowed transition paths to the path metrics of the first trellis column. 'Compare' refers to the fact that in the nodes of the second trellis column, the values of the path metrics of the paths that are allowed to arrive in these nodes are compared with one another. 'Select' refers to the fact that in the node of the second trellis column a path representing the best path metrics value is selected as the path of the node in question, i.e. this path is the winner (or survivor) path. The lost paths are rejected. The trellis typically describes a binary-encoded signal, in which case there are two feasible paths 310, 312, 314, 316 from one node 300, 302 of the first trellis column to the two nodes 304, 306 of the second trellis column. For calculating the path metrics of nodes 304, 306, one ACS-operation is needed for each node. Usually the transition path of the winner path is stored in a memory for further processing. For example, when the winner path of the node 304 has arrived along the transition path 310, then a bit with value 0 is stored in the memory, and when the winner path of the node 304 has arrived along the transition path 312, then a bit with value 1 is stored in the memory.

In the butterfly chart of FIG. 3B the values X and Y of the new path metrics can be calculated e.g. as follows:

$$\begin{cases} X = \max(A + P1, B + P2) \\ Y = \max(A + P3, B + P4), \end{cases} \quad (1)$$

where A and B are the values of the path metrics from the preceding trellis column and P1, P2, P3 and P4 are the corresponding values of the branch metrics between the nodes. Information on the transition path may be stored such that a winning path stemming from the node 300 is denoted with a bit with value 0 and a winning path stemming from the node 302 is denoted with a bit with value 1. The path metrics of all nodes of one trellis column can be calculated by processing all butterfly charts.

Figure 4B:
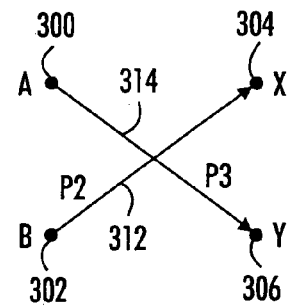
Figure 4C:
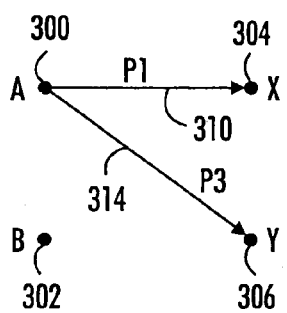
Figure 4D:
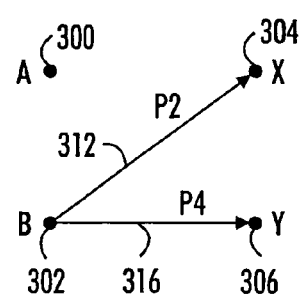

FIGS. 4A, 4B, 4C and 4D list all the possible ways in which the winner paths can be formed in the case of the example shown in the butterfly chart of FIG. 3B. FIG. 4A illustrates a case where the winner path of node 304 is path 310 and its rejected path is path 312, and the winner path of node 306 is path 316 and its rejected path is path 314. In FIG. 4B the winner path of node 304 is path 312 and its rejected path is path 310, and the winner path of node 306 is path 314 and its rejected path is path 316. In FIG. 4C the winner path of node 304 is path 310 and its rejected path is path 312, and the winner path of node 306 is path 314 and its rejected path is path 316. In FIG. 4D the winner path of node 304 is path 312 and its rejected path is path 310, and the winner path of node 306 is path 316 and its rejected path is path 314.

Figure 5A:
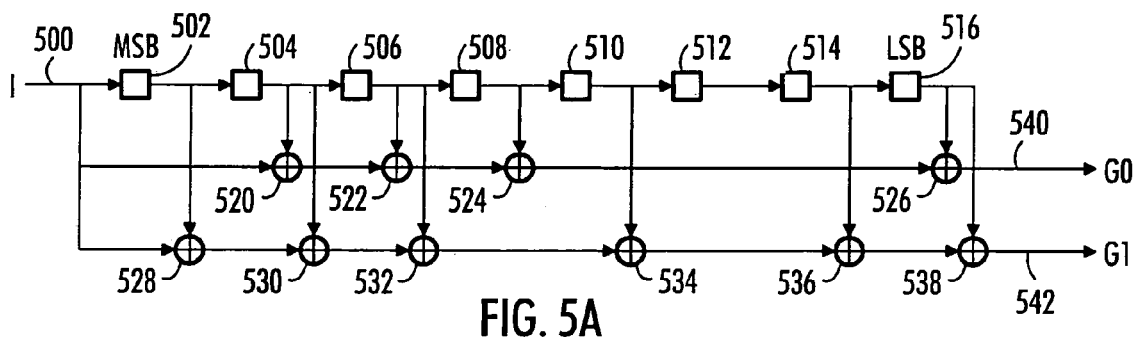
FIG. 5A illustrates an encoder whose coding rate is ½ for a convolutional code with 256 states.
Figure 5B:
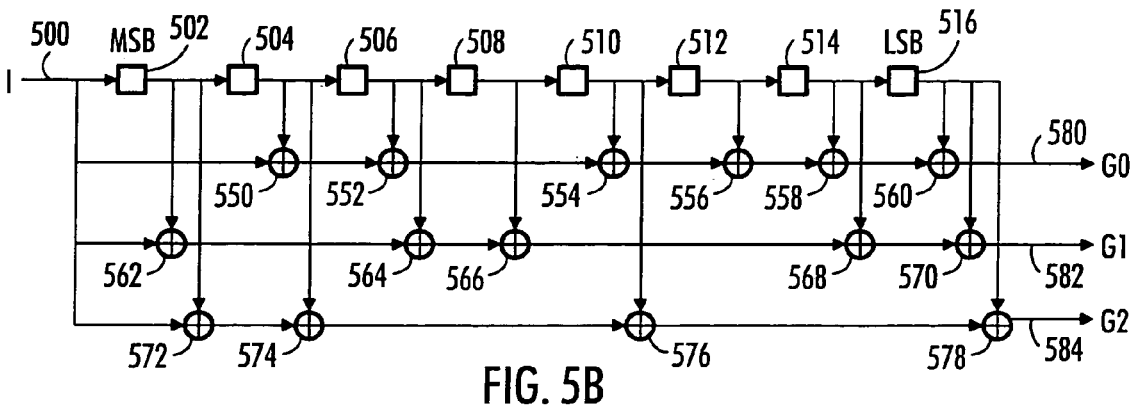
FIG. 5B illustrates an encoder whose coding rate is ⅓ for a convolutional code with 256 states.

Above it has been explained how the trellis relates to the convolutional code. In the example code the number of states is relative small, eight, which is also the length of the trellis column. All new path metrics of one trellis column can be calculated simultaneously utilizing only eight ACS-units. The more the code has states, the better the protection against interference. Also the coding rate influences positively the protection capability of the code: the smaller the rate, the better the protection. FIG. 5A presents a convolutional encoder whose coding rate is ½, and whose coding polynomials are $G0(x)=1+x^2+x^3+x^4+x^8$ and $G1(x)=1+x+x^2+x^3+x^5$ states is 256. Input bit enters the input 500 of the encoder. The delay elements 502, 504, 506, 508, 510, 512, 514, 516 each have a value of 0 or 1. The encoder also comprises the summing blocks 520, 522, 524, 526, 528, 530, 532, 534, 536, 538. As with the encoder of FIG. 2, the encoder state is a number where the least significant bit (LSB) is on the right and the most significant bit (MSB) on the left. For example, state 128=10000000 is such that the leftmost delay element 502 has value 1 and all other delay elements each have value 0. The encoder has two outputs 540 and 542. In FIG. 5B there is presented a similar encoder with 256 states but with a coding rate ⅓ and with coding polynomials $G0(x)=1+x^2+x^3+x^5+x^6+x^7+x^8$, $G1(x)=1+x^3+x^4+x^7+x^8$, and $G2(x)=1+x+x^2+x^5+x^8$. The encoder of FIG. 5B has three outputs 580, 582, 584, and thus also more summing blocks 550, 552, 554, 556, 558, 560, 562, 564, 566, 568, 570, 572, 574, 576, 578 than the encoder of FIG. 5A.

Figure 6:
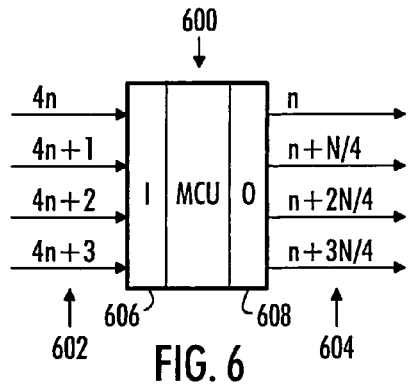
FIG. 6 illustrates a path metrics calculation unit with four parallel buses.
Figure 7:
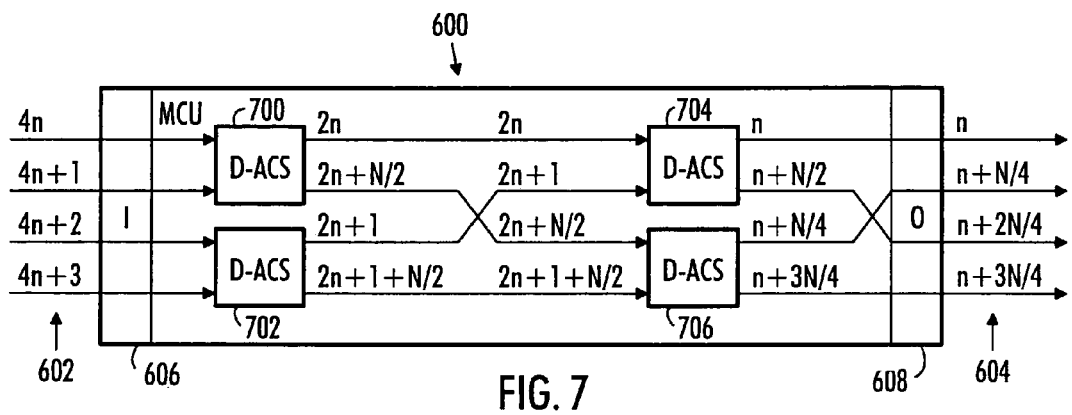
FIG. 7 illustrates the structure of the path metrics calculation unit with double ACS-units.

With reference to FIGS. 6 and 7, the calculation of path metrics over two columns using eight ACS-units, which are divided into two groups each having four ACS-units, is examined. These two groups are connected to each other. Each group calculates the path metrics of one trellis column such that the latter group takes on the calculation from the path metrics calculated by the previous group. Between the incoming path metrics 602 of the path metrics calculation unit 600 and the outgoing path metrics 604 of the path metrics calculation unit 600 there is determined the following relation: the incoming path metrics of the state 4n+p corresponds with the outgoing path metrics of the state n+pN/4, where N is the total number of code states, n gets the values 0, 1, 2, . . . , N/4−1, and p gets the values 0, 1, 2 and 3. In an input interface 606 of the path metrics calculation unit 600 the path metrics comprise sets having four path metrics each such that the path metrics of the states 4n, 4n+1, 4n+2 and 4n+3 belong to each set. When the path metrics of the incoming group 602, i.e. 4n, 4n+1, 4n+2 and 4n+3, are fed into the input interface 606 of the path metrics calculation unit 600, then after processing the set in the ACS-units, the path metrics of the corresponding outgoing set 604, i.e. n, n+N/4, n+2N/4 and n+3N/4, are obtained from the output interface 608 of the path metrics calculation unit 600, as illustrated by FIG. 6.

Within the path metrics calculation unit 600 the trellis of the code determines the path metrics of the states, as illustrated in FIG. 7. For the first column the input path metrics are processed as follows: the path metrics of states 2n and 2n+N/2 are calculated in the double ACS-unit 700 from the path metrics of states 4n and 4n+1, and the path metrics of states 2n+1 and 2n+1+N/2 are calculated in the double ACS-unit 702 from the path metrics of states 4n+2 and 4n+3. For the second column the path metrics of the first column are processed as follows: the path metrics of states n and n+N/2 are calculated in the double ACS-unit 704 from the path metrics of states 2n and 2n+1, and the path metrics for states n+N/4 and n+3N/4 are calculated in the double ACS-unit 706 from the path metrics of states 2n+N/2 and 2n+N/2+1.

Figure 8:
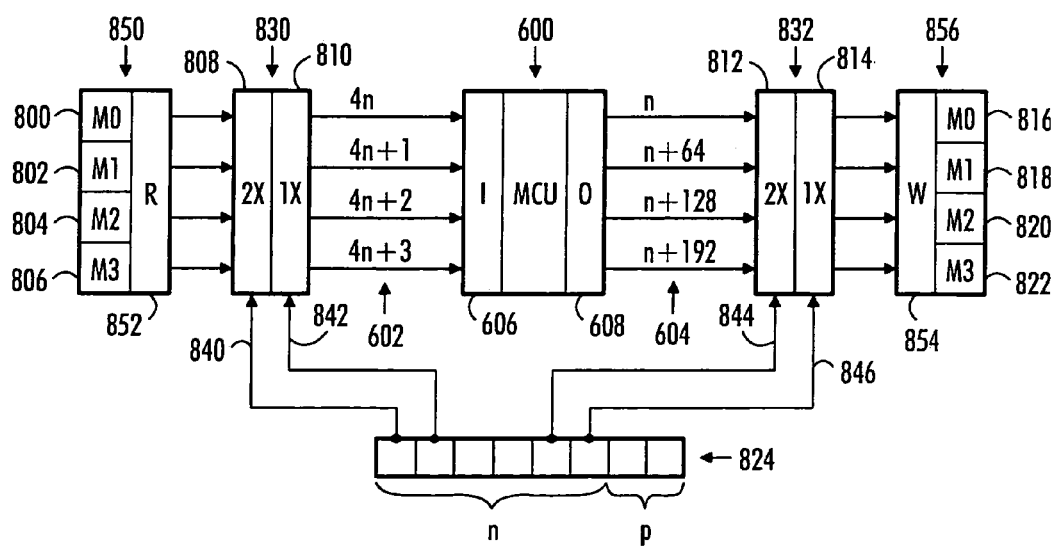
FIG. 8 is a simplified block diagram illustrating a decoder for a trellis code, especially illustrating the parts needed for routing the input and output buses of the path metrics calculation, when the calculation is performed over two trellis columns.

Next it is examined with reference to FIG. 8 how the path metrics are placed in the memory 850, 856, how they are fed into the input interface 606 of the path metrics calculation unit 600 from the memory 850, and how they are fed from the output interface 608 of the path metrics calculation unit 600 back into the memory 856. Four path metrics memories 800, 802, 804, 806 are needed for the old path metrics and other four path metrics memories 816, 818, 820, 822 are needed for the new path metrics. If the memories are dual-port memories, then only four path memories altogether are needed. Both the memories of the old path metrics and the memories of the new path metrics are numbered from 0 to 3 and they are thus correspondingly denoted as M0, M1, M2 and M3. The path metrics of each state always belong to the memory with the same denotation irrespective of whether it is old or new path metrics. Let us denote the state with s that gets the values 0, 1, 2, 3, . . . , N−1. The path metrics of the states belong to the memory Mk, where k=0,1,2,3, if $$(s \text{ div } (N/4)) \text{ XOR } (s \text{ mod } 4) = k, \quad (2)$$

where XOR is a bit-wise exclusive OR for a binary number. Thus xy =ab XOR cd means that x=a XOR c and y=b XOR d. By X div Y is denoted integral part of the division (X/Y), and by A mod B is denoted the remainder of the division (A/B). The address of state s in the corresponding memory is $$(s \text{ div } 4). \quad (3)$$

Table 2 illustrates the contents of the four memories for a code having 256 states.

The four read addresses of an n:th input set, that is, the path metrics of the states 4n, 4n+1, 4n+2 and 4n+3, are the same for all four path metrics and the addresses are n for the memories M0, M1, M2, M3. The write addresses of the output path metrics of the n:th input set, that is, the write addresses of the path metrics of the states n, n+N/4, n+2N/4 and n+3N/4, are equal to n div 4, (n+N/4) div 4, (n+2N/4) div 4, and (n+3N/4) div 4 at the input of the output multiplexer. The write addresses are routed with their path metrics using a multiplexer, as will be explained below.

The path metrics coming into the path metrics calculation unit 600 are always in the same order, for n=49 the order is 196, 197, 198, 199, for example, but in the memory the order of the path metrics varies in accordance with the number value of the state, the order in memory for n=49 is 199, 198, 197, 196, cf. Table 2, FIGS. 5A, 5B and 6. Thus between the memories 800, 802, 804, 806, 816, 818, 820, 822 and the path metrics calculation unit 600 we need multiplexers 830, 832, i.e. bus control switches, in order to route path metrics correctly while transferring the path metrics information between the memories and the path metrics calculation unit. In Table 2 the operation of the input multiplexer 830 is illustrated in the column IN MUX and the output multiplexer 832 in the column OUT MUX.

TABLE 2

| Index | Memory | | | | IN | OUT |
|---|---|---|---|---|---|---|
| n | M0 | M1 | M2 | M3 | MUX | MUX |
| 0 | 0 | 1 | 2 | 3 | 0X | 0X |
| 1 | 4 | 5 | 6 | 7 | 0X | 1X |
| 2 | 8 | 9 | 10 | 11 | 0X | 2X |
| 3 | 12 | 13 | 14 | 15 | 0X | 1X2X |
| 4 | 16 | 17 | 18 | 19 | 0X | 0X |
| 5 | 20 | 21 | 22 | 23 | 0X | 1X |
| 6 | 24 | 25 | 26 | 27 | 0X | 2X |
| 7 | 28 | 29 | 30 | 31 | 0X | 1X2X |
| 8 | 32 | 33 | 34 | 35 | 0X | 0X |
| 9 | 36 | 37 | 38 | 39 | 0X | 1X |
| 10 | 40 | 41 | 42 | 43 | 0X | 2X |
| 11 | 44 | 45 | 46 | 47 | 0X | 1X2X |
| 12 | 48 | 49 | 50 | 51 | 0X | 0X |
| 13 | 52 | 53 | 54 | 55 | 0X | 1X |
| 14 | 56 | 57 | 58 | 59 | 0X | 2X |
| 15 | 60 | 61 | 62 | 63 | 0X | 1X2X |
| 16 | 65 | 64 | 67 | 66 | 1X | 0X |
| 17 | 69 | 68 | 71 | 70 | 1X | 1X |
| 18 | 73 | 72 | 75 | 74 | 1X | 2X |
| 19 | 77 | 76 | 79 | 78 | 1X | 1X2X |
| 20 | 81 | 80 | 83 | 82 | 1X | 0X |
| 21 | 85 | 84 | 87 | 86 | 1X | 1X |
| 22 | 89 | 88 | 91 | 90 | 1X | 2X |
| 23 | 93 | 92 | 95 | 94 | 1X | 1X2X |
| 24 | 97 | 96 | 99 | 98 | 1X | 0X |
| 25 | 101 | 100 | 103 | 102 | 1X | 1X |
| 26 | 105 | 104 | 107 | 106 | 1X | 2X |
| 27 | 109 | 108 | 111 | 110 | 1X | 1X2X |
| 28 | 113 | 112 | 115 | 114 | 1X | 0X |
| 29 | 117 | 116 | 119 | 118 | 1X | 1X |
| 30 | 121 | 120 | 123 | 122 | 1X | 2X |
| 31 | 125 | 124 | 127 | 126 | 1X | 1X2X |
| 32 | 130 | 131 | 128 | 129 | 2X | 0X |
| 33 | 134 | 135 | 132 | 133 | 2X | 1X |
| 34 | 138 | 139 | 136 | 137 | 2X | 2X |
| 35 | 142 | 143 | 140 | 141 | 2X | 1X2X |
| 36 | 146 | 147 | 144 | 145 | 2X | 0X |
| 37 | 150 | 151 | 148 | 149 | 2X | 1X |
| 38 | 154 | 155 | 152 | 153 | 2X | 2X |
| 39 | 158 | 159 | 156 | 157 | 2X | 1X2X |
| 40 | 162 | 163 | 160 | 161 | 2X | 0X |
| 41 | 166 | 167 | 164 | 165 | 2X | 1X |
| 42 | 170 | 171 | 168 | 169 | 2X | 2X |
| 43 | 174 | 175 | 172 | 173 | 2X | 1X2X |
| 44 | 178 | 179 | 176 | 177 | 2X | 0X |
| 45 | 182 | 183 | 180 | 181 | 2X | 1X |
| 46 | 186 | 187 | 184 | 185 | 2X | 2X |
| 47 | 190 | 191 | 188 | 189 | 2X | 1X2X |

TABLE 2-continued

| Index | Memory | | | | IN | OUT |
|---|---|---|---|---|---|---|
| n | M0 | M1 | M2 | M3 | MUX | MUX |
| 48 | 195 | 194 | 193 | 192 | 1X2X | 0X |
| 49 | 199 | 198 | 197 | 196 | 1X2X | 1X |
| 50 | 203 | 202 | 201 | 200 | 1X2X | 2X |
| 51 | 207 | 206 | 205 | 204 | 1X2X | 1X2X |
| 52 | 211 | 210 | 209 | 208 | 1X2X | 0X |
| 53 | 215 | 214 | 213 | 212 | 1X2X | 1X |
| 54 | 219 | 218 | 217 | 216 | 1X2X | 2X |
| 55 | 223 | 222 | 221 | 220 | 1X2X | 1X2X |
| 56 | 227 | 226 | 225 | 224 | 1X2X | 0X |
| 57 | 231 | 230 | 229 | 228 | 1X2X | 1X |
| 58 | 235 | 234 | 233 | 232 | 1X2X | 2X |
| 59 | 239 | 238 | 237 | 236 | 1X2X | 1X2X |
| 60 | 243 | 242 | 241 | 240 | 1X2X | 0X |
| 61 | 247 | 246 | 245 | 244 | 1X2X | 1X |
| 62 | 251 | 250 | 249 | 248 | 1X2X | 2X |
| 63 | 255 | 254 | 253 | 252 | 1X2X | 1X2X |

Thus the decoder for the trellis code comprises the path metrics calculation unit 600 for calculating path metrics over at least two trellis columns columns in a trellis. The path metrics calculation unit 600 includes an input interface 606 for old path metrics and an output interface 608 for new path metrics. The decoder also comprises the memory 850, 856 for storing path metrics of the trellis. The memory 850, 856 includes a read interface 852 for reading old path metrics from the memory 850 and a write interface 854 for writing new path metrics into the memory 856. The decoder also comprises two multiplexers: an input multiplexer 830 connected between the read interface 852 of the memory 850 and the input interface 606 of the path metrics calculation unit 600, and an output multiplexer 832 connected between the output interface 608 of the path metrics calculation unit 600 and the write interface 854 of the memory 856. And finally, for the calculation of the path metrics we need a control 840, 842, 844, 846 in the decoder for controlling configuration of the input multiplexer 830 and configuration of the output multiplexer 832 on the basis of states 824 of the trellis. The state 824 of the trellis defines the way the old path metrics and the new path metrics relate to each other, whereby internal configuration of the path metrics calculation unit 600 remains the same for different different code constraint lengths.

The decoder for the trellis code is usually implemented by one or more application-specific integrated circuits (ASIC). Other hardware implementations may also be feasible, such as a circuit made of separate logic components, or even a software implementation, such as a processor with software, provided that enough processing capacity and speed is provided by the implementation. A hybrid combination of these implementation techniques is also possible. In selecting the implementation technique, a person skilled in the art will take into consideration for instance the requirements set on the size and power consumption of the device, the required processing power and speed, manufacturing costs and production volumes.

In an embodiment the multiplexer 830, 832 includes as many interconnected sub-multiplexers 808, 810, 812, 814 as there are trellis columns over which the path metrics are calculated. In the embodiment of FIG. 8 both the input multiplexer 830 and the output multiplexer 832 include two serially interconnected sub-multiplexers 808, 810 and 812, 814. In the first sub-multiplexer 810, 814 two neighboring buses exchange data. The first sub-multiplexer 810, 814 is denoted with 1X. In the second sub-multiplexer 808, 812 two neighboring bus pairs exchange data. The second sub-multiplexer 808, 812 is denoted with 2X. The order between the sub-multiplexers is irrelevant as long as the control signals take the order into account. The control can be such that if the control signal has value 1 the exchange is performed, with value 0 the exchange is not performed. Such an operation of the multiplexer where neither sub-multiplexer changes the order of the buses is denoted with 0X, i.e. it is a direct connection. Denotations 0X, 1X and 2X are also used in Table 2. Denotation 1X2X means that both 1X and 2X are performed.

In an embodiment the control 840, 842, 844, 846 includes a binary counter 824 representing a state of the trellis. The control 840, 842, 844, 846 depends on the bit values of predetermined positions in the binary counter 824. In our example the control is realized by a number value of the state s that can be expressed with index n as follows: s=4n+p, where n=0, 1, 2, . . . , N/4−1 and p=0, 1, 2, 3. When the state is expressed as a binary number, then its most significant bit controls 840 the 2X sub-multiplexer 808 in the input multiplexer 830, and its second most significant bit controls 842 the 1X sub-multiplexer 810 in the input multiplexer 830. Consistently this can be expressed such that the most significant bit of the index n controls 840 the 2X sub-multiplexer 808 in the input multiplexer 830, and its second most significant bit controls 842 the 1X sub-multiplexer 810 in the input multiplexer 830. The least significant bit of the index n controls 846 the 1X sub-multiplexer 814 in the output multiplexer 832, and its second least significant bit controls 844 the 2X sub-multiplexer 812 in the output multiplexer 832. Consistently the output multiplexer 832 can be controlled 844, 846 with the third and fourth least significant bits of the state s, because in our example n=s/4. The update step of the state s is 4 and that of n is 1.

Let us examine Table 2 and FIG. 8. When index n=0, the path metrics of states 0, 1, 2 and 3 are taken from the address 0 of four memories 800, 802, 804, 806 and the path metrics are then fed through the input multiplexer 830 into the path metrics calculation unit 600. Because n=0=000000, the input multiplexer 830 does not perform any exchanges between the buses, and hence the old path metrics remain in the original buses. The path metrics calculation unit 600 calculates the new path metrics of the states 0, 64, 128 and 192 from the path metrics of the states 0, 1, 2 and 3. These new path metrics are fed through the output multiplexer 832 into four memories 816, 818, 820, 822. Because n=000000, the output multiplexer 832 does not perform any exchanges between the buses, and hence the new path metrics remain in the original buses: the path metrics of the state 0 is stored in the M0 memory 816, the path metrics of the state 64 is stored in the M1 memory 818, the path metrics of the state 128 is stored in the M2 memory 820, and the path metrics of the state 192 are is stored in the M3 memory 822. For each state 0, 64, 128 and 192 the address is the number value of the state divided by four, i.e. 0, 16, 32 and 48, as can be seen from Table 1.

In the next phase 1 is set as the value for index n, whereupon the path metrics of the states 4, 5, 6 and 7 are fetched from the memories 800, 802, 804, 806 through the input multiplexer 830 into the path metrics calculation unit 600. Because two highest bits of the index n=000001 still have value zero, the input multiplexer 830 does not perform any exchanges between the buses, i.e. the path metrics remain in their original buses. The path metrics 193 from the old path metrics of the states 4, 5, 6 and 7, and the new path metrics are stored through the output multiplexer 832 in the memories 816, 818, 820, 822. As the least significant bit of index n has value 1, the 1X sub-multiplexer 814 of the output multiplexer 832 exchanges the data within each pair of two neighboring buses. In the row n=1 in Table 2 in column OUT MUX we now have 1X. Thus the order 1, 65, 129 and 193 is now changed into the order 65, 1, 193 and 129. The path metrics of the state 65 is stored in the address 16 of the M0 memory 816, the path metrics of the state 1 is stored in the address 0 of the M1 memory 818, the path metrics of the state 193 is stored in the address 48 of the M2 memory 820, and the path metrics of the state 129 are stored in the address 32 of the M3 memory 822, as is illustrated in Table 2.

In this way all values of the index n will be processed. As a final example when n=50=110010, then the path metrics of the states 203, 202, 201 and 200 will be retrieved from the memories 800, 802, 804, 806. Because two highest bits of the index n have value 1, then the input multiplexer 830 performs exchange both in the 1X sub-multiplexer 810 and in the 2X sub-multiplexer 808. Due to this the path metrics calculation unit 600 receives the path metrics in the right order of 200, 201, 202 and 203. The path metrics calculation unit 600 then calculates the new path metrics of the states 50, 114, 178 and 242. Because the index n=110010, the output multiplexer 832 performs exchange in its 2X sub-multiplexer 812. After the output multiplexer 832 the order of the path metrics is 178, 242, 50 and 114. The path metrics of the state 178 is stored in the address 44 of the M0 memory 816, the path metrics of the state 242 is stored in the address 60 of the M1 memory 818, the path metrics of the state 50 is stored in the address 12 of the M2 memory 820, and the path metrics of the state 114 are stored in the address 28 of the M3 memory 822, as is illustrated in Table 2.

The described solution is used for decoding of convolutional codes having different code constraint lengths as the change in the code constraint length is taken into account. This means that the control signals 840, 842 of the input multiplexer 830 have to be taken from a different place in the state register 824 for a code with 128 states than for a code with 256 states, because the number of states has been changed. Therefore the construction of the path metrics calculation unit 600 need not be changed as the code constraint length varies.

Figure 9:
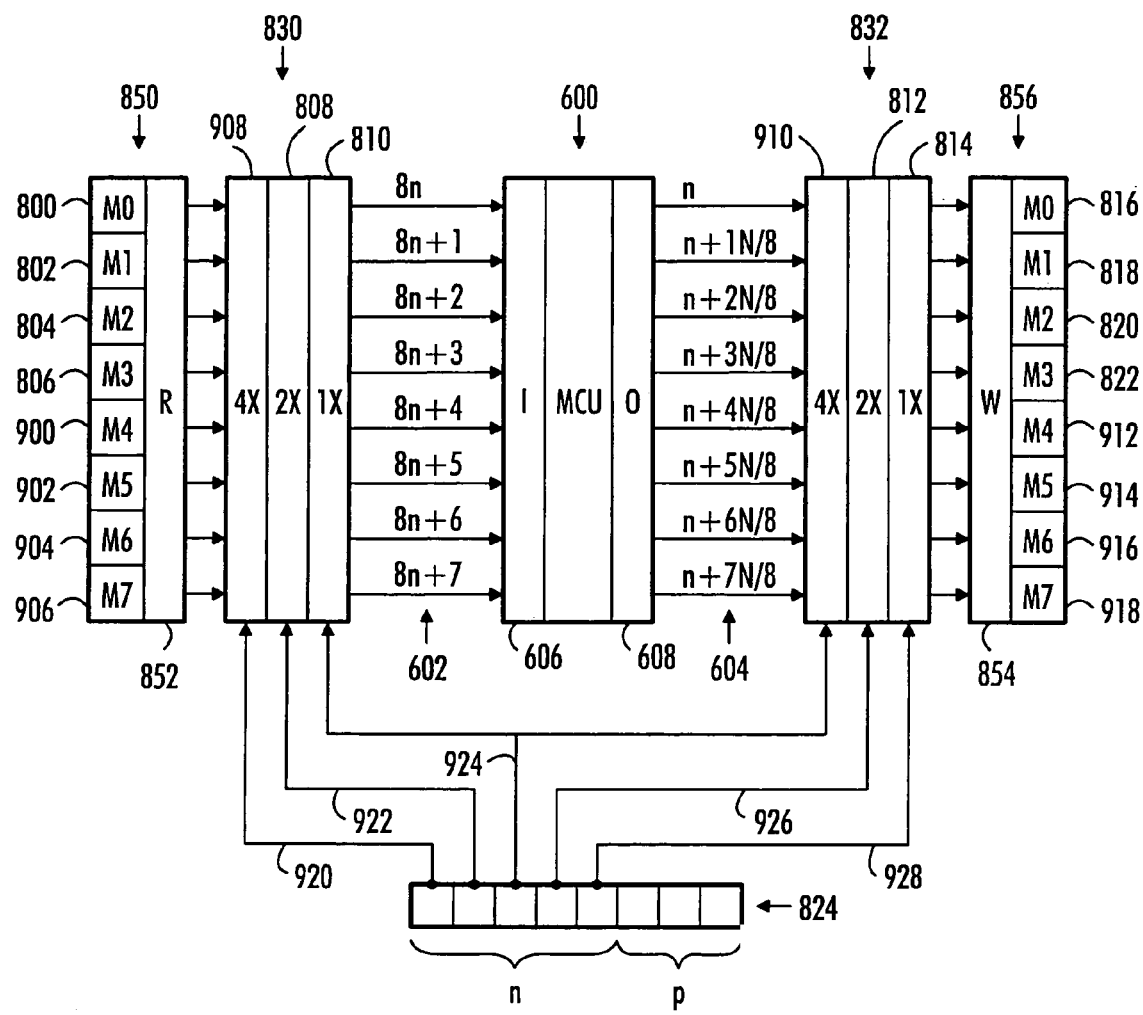
FIG. 9 illustrates a trellis decoder when the calculation is extended over three trellis columns.

Even though the foregoing example describes the path metrics calculation over two columns, the solution can be adapted to the calculation of path metrics over three or four trellis columns, for example. When the calculation is performed over three trellis columns, eight ACS-units are needed for each column and thus altogether 24 ACS-units are needed. FIG. 9 illustrates a trellis decoder that computes the path metrics over three trellis columns without saving the path metrics in the memory between the three columns. In this case the path metric of the state 8n+p at the input interface 606 of the path metrics calculation unit 600 is associated with the path metric of the state n+pN/8 at the output interface 608 of the path metrics calculation unit 600, here n=0, 1, 2, . . . , N/8−1, and p=0, 1, 2, 3, 4, 5, 6, 7, and N is the number of the states. The n:th set 602 of the ingoing path metrics consists of the path metrics of the states 8n, 8n+1, 8n+2, 8n+3, 8n+4, 8n+5, 8n+6, 8n+7 the corresponding outgoing set 604 is n, n+N/8, n+2N/8, n+3N/8, n+4N/8, n+5N/8, n+6,N/8, and n+7N/8. Table 3 shows how the path metrics of a 256-state code are stored in eight memories 800, 802, 804, 806, 900, 902, 904, 906 and how the I/O-multiplexers 830, 832 route path metrics from the input memories 850 to the path metrics calculation unit 600 and from there to the output memories 816, 818, 820, 822, 912, 914, 916, 918.

In the embodiment of FIG. 9 both the input multiplexer 830 and the output multiplexer 832 include three serially interconnected sub-multiplexer 808, 810, 908 and 812, 814, 910. The third sub-multiplexer 908, 910 exchanges data between two groups, each having four adjoining buses. The third sub-multiplexer 908, 910 is denoted with 4X. The control is now a little different from that in FIG. 8. Index n in the binary counter 824 has now five bits and p has three bits. Three most significant bits of n now control the sub-multiplexers of the input multiplexer 830, and three least significant bits control the sub-multiplexers of the output multiplexer 832, with control signals 920, 922, 924, 926 and 928 as illustrated in FIG. 9.

The path metrics of the state s belong to the memory Mk, where k=0,1, 2, 3, 4, 5, 6, 7, if $$(s \ \mathrm{div} \ (N/8)) \ \mathrm{XOR} \ (s \ \mathrm{mod} \ 8) = k, \quad (4)$$

where XOR is a bit-wise exclusive OR for a binary number. Thus xyz=abc XOR def means that x=a XOR d, y=b XOR e, and z=c XOR f. The address of state s in the corresponding memory is $$(s \ \mathrm{div} \ 8). \quad (5)$$

Table 3 illustrates the contents of the memories for a code with 256 states. For example, if the state is 242, then 242 div (256/8)=7 and 242 mod 8=2, so 111 XOR 010=101, which is 5 in decimal. Also 242 div 8=30. The path metric of the state 242 is in the memory M5 at the address 30.

For instance, when n=0, the path metrics of the states 0, 1, 2, 3, 4, 5, 6 and 7 are transferred from the address 0 of the eight input memories 850 via the input multiplexer 830 to the path metrics calculation unit 600. The input multiplexer 830 does not exchange the routes of the path metrics since the three most significant bits of n are zeros, n=00000. The path metric calculation unit 600 outputs the path metrics of the states 0, 32, 64, 96, 128, 160, 192 and 224 that pass through the output multiplexer 832 that does not change their buses because the three least significant bits of n are zeros, n=00000. The address of each new path metric in its memory 856 equals to the value of its state divided by 8, only the integer part of the quotient counts. So the path metric of the state 0 has the output address 0 for the memory M0, the path metric of the state 32 has the output address 4 for the memory M1, and so on. When n=23, the path metrics of the states 189, 188, 191, 190, 185, 184, 187 and 186 are read from the address 23 of each input memory 850. Now the input multiplexer 830 exchanges the buses of the path metrics since the three most significant bits of n=10111 are 101. The input multiplexer 830 performs exchanges with the first 1X sub-multiplexer 810 and the third 4X sub-multiplexer 908, so the order of path metrics at the input 606 of the path metrics calculation unit 600 is 184, 185, 186, 187, 188, 189, 190 and 191. After processing, the path metrics calculation unit 600 outputs the path metrics of the states 23, 55, 87, 119, 151, 183, 215 and 247. These path metrics go through the output multiplexer 832 that interchanges buses between the path metrics according to the three least significant bits of n=10111. Because all three bits are ON, all three different types of routing are done: 1X, 2X and 4X sub-multiplexers 814, 812, 910 all perform exchanges. These routings result in the order 247, 215, 183, 151, 119, 87, 55 and 23 of the path metrics. The address of the path metric of the state 247 at the memory M0 is 30, the address path metric of the state 215 at the memory M1 is 26, and so on.

TABLE 3

| | Memory | | | | | | | | | |
|---|---|---|---|---|---|---|---|---|---|---|
| Index n | M0 | M1 | M2 | M3 | M4 | M5 | M6 | M7 | IN MUX | OUT MUX |
| 0 | 0 | 1 | 2 | 3 | 4 | 5 | 6 | 7 | 0X | 0X |
| 1 | 8 | 9 | 10 | 11 | 12 | 13 | 14 | 15 | 0X | 1X |
| 2 | 16 | 17 | 18 | 19 | 20 | 21 | 22 | 23 | 0X | 2X |
| 3 | 24 | 25 | 26 | 27 | 28 | 29 | 30 | 31 | 0X | 1X2X |
| 4 | 33 | 32 | 35 | 34 | 37 | 36 | 39 | 38 | 1X | 4X |
| 5 | 41 | 40 | 43 | 42 | 45 | 44 | 47 | 46 | 1X | 1X4X |
| 6 | 49 | 48 | 51 | 50 | 53 | 52 | 55 | 54 | 1X | 2X4X |
| 7 | 57 | 56 | 59 | 58 | 61 | 60 | 63 | 62 | 1X | 1X2X4 |
| 8 | 66 | 67 | 64 | 65 | 70 | 71 | 68 | 69 | 2X | 0X |
| 9 | 74 | 75 | 72 | 73 | 78 | 79 | 76 | 77 | 2X | 1X |
| 10 | 82 | 83 | 80 | 81 | 86 | 87 | 84 | 85 | 2X | 2X |
| 11 | 90 | 91 | 88 | 89 | 94 | 95 | 92 | 93 | 2X | 1X2X |
| 12 | 99 | 98 | 97 | 96 | 103 | 102 | 101 | 100 | 1X2X | 4X |
| 13 | 10 | 10 | 105 | 104 | 111 | 110 | 109 | 108 | 1X2X | 1X4X |
| 14 | 11 | 11 | 113 | 112 | 119 | 118 | 117 | 116 | 1X2X | 2X4X |
| 15 | 12 | 12 | 121 | 120 | 127 | 126 | 125 | 124 | 1X2X | 1X2X4 |
| 16 | 13 | 13 | 134 | 135 | 128 | 129 | 130 | 131 | 4X | 0X |
| 17 | 14 | 14 | 142 | 143 | 136 | 137 | 138 | 139 | 4X | 1X |
| 18 | 14 | 14 | 150 | 151 | 144 | 145 | 146 | 147 | 4X | 2X |
| 19 | 15 | 15 | 158 | 159 | 152 | 153 | 154 | 155 | 4X | 1X2X |
| 20 | 16 | 16 | 167 | 166 | 161 | 160 | 163 | 162 | 1X4X | 4X |
| 21 | 17 | 17 | 175 | 174 | 169 | 168 | 171 | 170 | 1X4X | 1X4X |
| 22 | 18 | 18 | 183 | 182 | 177 | 176 | 179 | 178 | 1X4X | 2X4X |
| 23 | 18 | 18 | 191 | 190 | 185 | 184 | 187 | 186 | 1X4X | 1X2X4 |
| 24 | 19 | 19 | 196 | 197 | 194 | 195 | 192 | 193 | 2X4X | 0X |
| 25 | 20 | 20 | 204 | 205 | 202 | 203 | 200 | 201 | 2X4X | 1X |
| 26 | 21 | 21 | 212 | 213 | 210 | 211 | 208 | 209 | 2X4X | 2X |
| 27 | 22 | 22 | 220 | 221 | 218 | 219 | 216 | 217 | 2X4X | 1X2X |
| 28 | 23 | 23 | 229 | 228 | 227 | 226 | 225 | 224 | 1X2X4 | 4X |
| 29 | 23 | 23 | 237 | 236 | 235 | 234 | 233 | 232 | 1X2X4 | 1X4X |

TABLE 3-continued

| | Memory | | | | | | | | | |
|---|---|---|---|---|---|---|---|---|---|---|
| Index n | M0 | M1 | M2 | M3 | M4 | M5 | M6 | M7 | IN MUX | OUT MUX |
| 30 | 24 | 24 | 245 | 244 | 243 | 242 | 241 | 240 | 1X2X4 | 2X4X |
| 31 | 25 | 25 | 253 | 252 | 251 | 250 | 249 | 248 | 1X2X4 | 1X2X4 |

When the calculation is performed over four trellis columns, 16 ACS units are needed for each column and thus altogether 64 ACS units are needed. The number of the sub-multiplexers within the input and output multiplexers increases in a similar way.

It is possible to connect two or more path metrics calculation units 600 in parallel to boost decoding capacity. For example, two path metrics calculation units of FIG. 8 have 16 ACS units to compute the path metrics over two trellis columns. Nevertheless, the path metric calculation units 600 can also be connected in a serial manner, i.e. by connecting two or more path metrics calculation units 600 into a serial chain. In this option an intermediate memory between the path metrics calculation units 600 need not be of a full size but capable to store 16 or 32 path metrics.

Even though the invention was described above with reference to the example according to the accompanying drawings, it is clear that the invention is not restricted thereto but may modified in various ways within the inventive concept disclosed in the appended claims.

The invention claimed is:

1. A decoder for a trellis code, comprising:
   a path metrics calculation unit for calculating path metrics over at least two trellis columns in a trellis, the path metrics calculation unit including an input interface for old path metrics and an output interface for new path metrics;
   a memory for storing path metrics of the trellis, the memory including a read interface for reading old path metrics from the memory and a write interface for writing new path metrics into the memory;
   an input multiplexer connected between the read interface of the memory and the input interface of the path metrics calculation unit;
   an output multiplexer connected between the output interface of the path metrics calculation unit and the write interface of the memory; and
   a control for controlling configuration of the input multiplexer and configuration of the output multiplexer on the basis of states of the trellis, which state of the trellis defines the way the old path metrics and the new path metrics relate to each other, whereby internal configuration of the path metrics calculation unit remains the same for different code constraint lengths.

2. A decoder according to claim 1, wherein the control includes a binary counter representing a state of the trellis, and the control depends on the bit values of predetermined positions in the binary counter.

3. A decoder according to claim 1, wherein the multiplexer includes as many interconnected sub-multiplexers as there are trellis columns over which the path metrics are calculated.

4. A decoder according to claim 1, wherein the multiplexer includes two interconnected sub-multiplexers, wherein in the first sub-multiplexer two neighboring buses exchange data and in the second sub-multiplexer two neighboring bus pairs exchange data.

5. A decoder according to claim 4, wherein the multiplexer further includes a third sub-multiplexer that exchanges data between two groups, each having four adjoining buses.

* * * * *

UNITED STATES PATENT AND TRADEMARK OFFICE
CERTIFICATE OF CORRECTION

PATENT NO. : 7,242,723 B2
APPLICATION NO. : 10/781492
DATED : July 10, 2007
INVENTOR(S) : Esko Nieminen It is certified that error appears in the above-identified patent and that said Letters Patent is hereby corrected as shown below:

Col. 6, line 51: "the states belong" should read --the state s belong--.

Col. 8, line 23: "trellis columns columns in" should read --trellis columns in--.

Col. 8, line 44: "for different different code" should read --for different code--.

Col. 9, line 24: "can be expressed expressed such" should read --can be expressed such--.

Col. 11, line 6: "sub-multiplexer 808, 810, 908" should read --sub-multiplexers 808, 810, 908--.

Signed and Sealed this

Twenty-eighth Day of August, 2007

JON W. DUDAS
*Director of the United States Patent and Trademark Office*